(12) United States Patent
Cok et al.

(10) Patent No.: US 7,594,839 B2
(45) Date of Patent: Sep. 29, 2009

(54) OLED DEVICE HAVING IMPROVED LIGHT OUTPUT

(75) Inventors: Ronald S. Cok, Rochester, NY (US);
Jin-Shan Wang, Pittsford, NY (US);
Raymond A. Kesel, Avon, NY (US);
Donald R. Preuss, Rochester, NY (US);
Yuan-Sheng Tyan, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 554 days.

(21) Appl. No.: 11/361,488

(22) Filed: Feb. 24, 2006

(65) Prior Publication Data
US 2007/0200496 A1 Aug. 30, 2007

(51) Int. Cl.
*H01J 9/24* (2006.01)
(52) U.S. Cl. ...................................... 445/24
(58) Field of Classification Search ............... 313/512, 313/14
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 5,869,215 A * | 2/1999 | Ong et al. | 430/137.14 |
| 5,955,837 A | 9/1999 | Horikx et al. | |
| 6,770,502 B2 * | 8/2004 | Cok et al. | 438/40 |
| 6,787,796 B2 | 9/2004 | Do et al. | |
| 2001/0026124 A1 | 10/2001 | Liu et al. | |
| 2004/0217702 A1 * | 11/2004 | Garner et al. | 313/512 |
| 2005/0018431 A1 | 1/2005 | Shiang | |

(Continued)

FOREIGN PATENT DOCUMENTS

| | | |
|---|---|---|
| EP | 1 603 367 | 12/2005 |
| WO | WO 02/37580 | 5/2002 |

OTHER PUBLICATIONS

U.S. Appl. No. 11/361,094, filed Feb. 24, 2006, titled *Light-Scattering Color-Conversion Material Layer* by Ronald S. Cok et al.

(Continued)

*Primary Examiner*—Toan Ton
*Assistant Examiner*—Hana A Sanei
(74) *Attorney, Agent, or Firm*—Andrew J. Anderson; Raymond L. Owens

(57) ABSTRACT

A top-emitting organic light-emitting diode (OLED) device, comprising: a substrate; an OLED comprising a reflective electrode formed on the substrate; one-or-more layers of organic light-emitting material formed over the reflective electrode; and a transparent electrode formed over the one-or-more layers of organic light-emitting material; a light-scattering layer having a rough surface formed over and in contact with the OLED, a cover affixed to the substrate forming a gap between the cover and the light scattering layer; and wherein the gap is a vacuum or the gap is filled with a relatively low-refractive index gas and the light-scattering layer comprises a plurality of relatively high-refractive index light-scattering transparent particles projecting into the gap without contacting the cover and further comprising an adhesive binder in contact with at least some of the light-scattering particles to adhere the light-scattering particles to the OLED.

8 Claims, 5 Drawing Sheets

U.S. PATENT DOCUMENTS

2005/0142379 A1  6/2005  Juni et al.
2005/0194896 A1* 9/2005  Sugita et al. ............... 313/506

OTHER PUBLICATIONS

U.S. Appl. No. 11/361,089, filed Feb. 24, 2006, titled *Top-Emitter OLED Device Structure And Method* by Ronald S. Cok et al.

C. W. Tang and S. A. VanSlyke; "Organic Electroluminescent Diodes"; Applied Physics Letters; vol. 51; No. 12; Sep. 21, 1987; pp. 913-915.

C. W. Tang, S. A. VanSlyke and C. H. Chen; "Electroluminescence Of Doped Organic Thin Films"; Journal of Applied Physics; vol. 65; No. 9; May 1, 1989; pp. 3610-3616.

Ronald S. Cok, Donald R. Preuss and Yuan-Sheng Tyan; U.S. Appl. No. 11/065,082, filed Feb. 24, 2005; titled "OLE Device Having Improved Light Output".

* cited by examiner

OLED DEVICE HAVING IMPROVED LIGHT OUTPUT

FIELD OF THE INVENTION

The present invention relates to organic light-emitting diode (OLED) devices, and more particularly, to OLED device structures for improving light output and reducing manufacturing costs.

BACKGROUND OF THE INVENTION

Organic light-emitting diodes (OLEDs) are a promising technology for flat-panel displays and area illumination lamps. The technology relies upon thin-film layers of materials coated upon a substrate. However, as is well known, much of the light output from the light-emissive layer in the OLED is absorbed within the device. Because light is emitted in all directions from the internal layers of the OLED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

OLED devices generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic light-emitting element, and a cathode. The organic element disposed between the anode and the cathode commonly includes an organic hole-transporting layer (HTL), an emissive layer (EML) and an organic electron-transporting layer (ETL). Holes and electrons recombine and emit light in the EML layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EL can determine how efficiently the electrons and holes be recombined and result in the emission of light, etc. It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer. Light generated from the device is emitted through the top transparent electrode. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

Referring to FIG. 5, a top-emitting OLED suggested by the prior-art has a transparent substrate 10, a reflective first electrode 12, one or more layers 14 of organic material, one of which is light-emitting, a transparent second electrode 16, a gap 19 and an encapsulating cover 20. The encapsulating cover 20 may be coated directly over the second transparent electrode 16 so that no gap 19 exists. When a gap 19 does exist, it may be filled with polymer or desiccants to add rigidity and reduce water vapor permeation into the device. Such filler may be selected to match the refractive index of the cover to reduce interlayer reflections at the interface thereof. Light emitted from one of the organic material layers 14 can be emitted directly out of the device, through the cover 20, as illustrated with light ray 1. If gap 19 is filled with a material of index greater than unity, light may also be emitted and internally guided in the cover 20 and organic layers 14, as illustrated with light ray 2. Alternatively, light may be emitted and internally guided in the layers 14 of organic material and transparent electrode 16, as illustrated with light ray 3. Light ray 4 emitted toward the reflective first electrode 12 are reflected by the reflective first electrode 12 toward the cover 20 and then follow one of the light ray paths 1, 2, or 3.

A variety of techniques have been proposed to improve the out-coupling of light from thin-film light emitting devices. One such technique is the use of scattering layers to scatter waveguided light of the layers in which they are trapped. For example, Chou (International Publication Number WO 02/37580 A1) and Liu et al. (U.S. Patent Application Publication No. 2001/0026124 A1) taught the use of a volume or surface scattering layer to improve light extraction. The scattering layer is applied next to the organic layers or on the outside surface of the glass substrate and has optical index that matches these layers. Light emitted from the OLED device at higher than critical angle that would have otherwise been trapped can penetrate into the scattering layer and be scattered out of the device. The efficiency of the OLED device is thereby improved but still has deficiencies as explained below.

U.S. Pat. No. 6,787,796 entitled "Organic electroluminescent display device and method of manufacturing the same" by Do et al. issued 20040907 describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers. U.S. Patent Application Publication No. 2004/0217702 entitled "Light extracting designs for organic light emitting diodes" by Garner et al., similarly discloses use of microstructures to provide internal refractive index variations or internal or surface physical variations that function to perturb the propagation of internal waveguide modes within an OLED. When employed in a top-emitter embodiment, the use of an index-matched polymer adjacent the encapsulating cover is disclosed. US20050142379 A1 entitled "Electroluminescence device, planar light source and display using the same" describes an organic electroluminescence device including an organic layer comprising an emissive layer; a pair of electrodes comprising an anode and a cathode, and sandwiching the organic layer, wherein at least one of the electrodes is transparent; a transparent layer provided adjacent to a light extracting surface of the transparent electrode; and a region substantially disturbing reflection and refraction angle of light provided adjacent to a light extracting surface of the transparent layer or in an interior of the transparent layer, wherein the transparent layer has a refractive index substantially equal to or more than the refractive index of the emissive layer.

However, scattering techniques, by themselves, cause light to pass through the light-absorbing material layers multiple times where they are absorbed and converted to heat. Moreover, trapped light may propagate a considerable distance horizontally through the cover, substrate, or organic layers before being scattered out of the device, thereby reducing the sharpness of the device in pixellated applications such as displays. For example, as illustrated in FIG. 6, a prior-art pixellated top-emitting OLED device may include a plurality of independently controlled pixels 50, 52, 54, 56, and 58 and a scattering layer 22 located between the transparent second electrode 16 and the cover 20. A light ray 5 emitted from the light-emitting layer 14 may be scattered multiple times by scattering layer 22, while traveling through the cover 20, organic layer(s) 14, and transparent second electrode 16 before it is emitted from the device. When the light ray 5 is finally emitted from the device, the light ray 5 may have traveled a considerable distance through the various device layers from the original pixel 50 location where it originated to a remote pixel 58 where it is emitted, thus reducing sharpness. Most of the lateral travel occurs in the cover 20, because that is by far the thickest layer in the package. Also, the amount of light emitted is reduced due to absorption of light in the various layers.

Light-scattering layers used internally to an OLED device are described in U.S. Patent Application Publication No. 2005/0018431 entitled "Organic electroluminescent devices having improved light extraction" by Shiang and U.S. Pat. No. 5,955,837 entitled "System with an active layer of a medium having light-scattering properties for flat-panel display devices" by Horikx, et al. These disclosures describe and define properties of scattering layers located on a substrate in detail. EP1603367 A1 entitled "Electroluminescence Device" an electroluminescent device successively comprising a cathode, an electroluminescent layer, a transparent electrode layer, an evanescent light-scattering layer comprising a matrix composed of a low-refractive material containing light-scattering particles, and a transparent sheet/plate. EP1603367 A1 also includes an internal low-refractive layer to inhibit the propagation of light in a cover or substrate.

Co-pending, commonly assigned U.S. Ser. No. 11/065, 082, filed Feb. 24, 2005, describes the use of a transparent low-index layer having a refractive index lower than the refractive index of the encapsulating cover or substrate through which light is emitted and lower than the organic layers to enhance the sharpness of an OLED device having a scattering element. US 20050194896 describes a nano-structure layer for extracting radiated light from a light-emitting device together with a gap having a refractive index lower than an average refractive index of the emissive layer and nano-structure layer. In various described embodiments, such nano-structure layer may be used in combination with color conversion material or color filter layers. Such disclosed designs still, however, do not completely optimize the use of emitted light, particularly for displays with four-color pixels including a white emitter.

Light-extracting layers as described in the above references are typically formed by creating a rough surface or coating scattering particles within a matrix of material. In the first case, it is difficult and expensive to form a rough surface on organic and electrode layers without damaging the layers, for example by employing blast treatments, corona treatments, plasma treatments, or etchants. In the second case, the scattering layer is limited in its scattering ability, thereby requiring a thicker layer than might otherwise be necessary, increasing the reflectivity and absorption of the layers and decreasing the amount of light output.

There is a need therefore for an improved organic light-emitting diode device structure that avoids the problems noted above and improves the efficiency and sharpness of the device.

SUMMARY OF THE INVENTION

In accordance with one embodiment, the invention is directed towards a top-emitting organic light-emitting diode (OLED) device, comprising:

a substrate;

an OLED comprising a reflective electrode formed on the substrate; one-or-more layers of organic light-emitting material formed over the reflective electrode; and a transparent electrode formed over the one-or-more layers of organic light-emitting material;

a light-scattering layer having a rough surface formed over and in contact with the OLED, a cover affixed to the substrate forming a gap between the cover and the light scattering layer; and wherein the gap is a vacuum or the gap is filled with a relatively low-refractive index gas and the light-scattering layer comprises a plurality of relatively high-refractive index light-scattering transparent particles projecting into the gap without contacting the cover and further comprising an adhesive binder in contact with at least some of the light-scattering particles to adhere the light-scattering particles to the OLED.

ADVANTAGES

The present invention has the advantage that it increases the light output from, and improves the sharpness of, an OLED device.

DETAILED DESCRIPTION OF THE INVENTION

Figure 1:
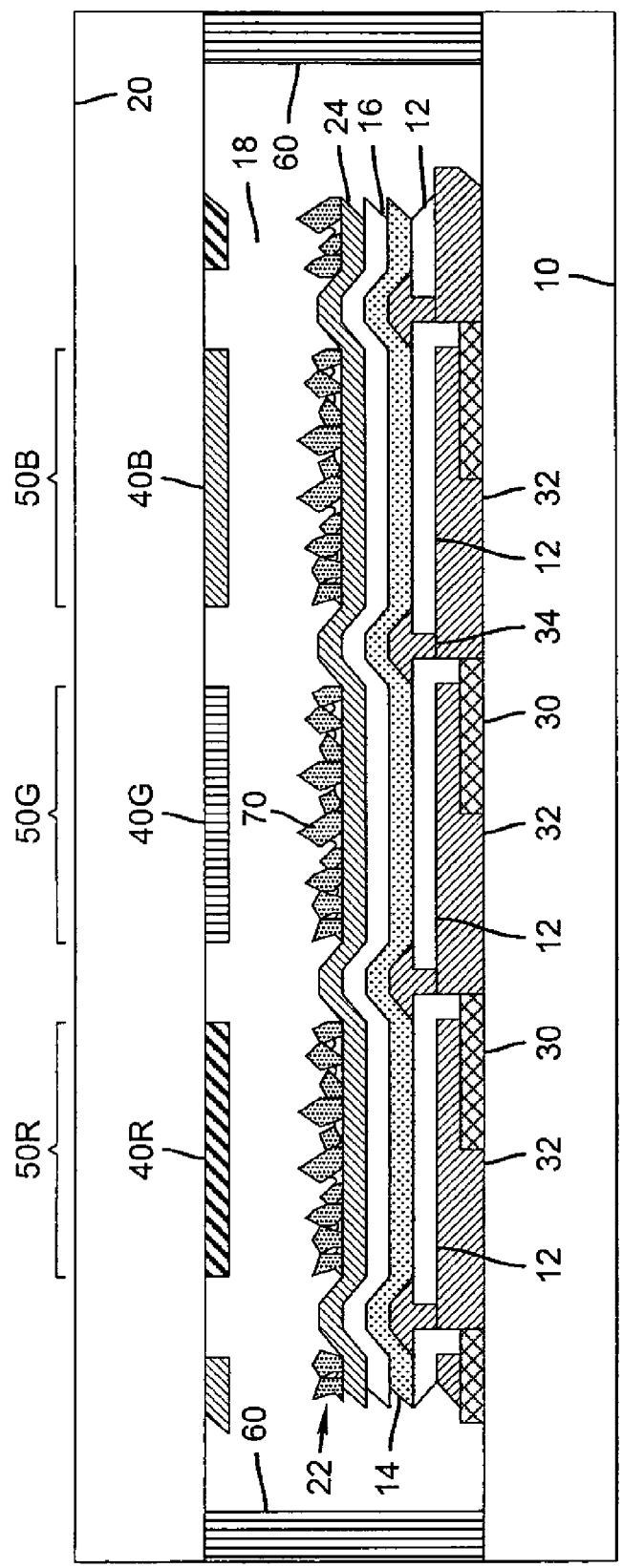
FIG. 1 illustrates a cross section of a top-emitter OLED device having a scattering layer according to one embodiment of the present invention.

Referring to FIG. 1, in accordance with one embodiment of the present invention, a top-emitting organic light-emitting diode (OLED) device, comprises a substrate 10; an OLED comprising a reflective electrode 12 formed on the substrate 10; one-or-more layers 14 of organic light-emitting material formed over the reflective electrode 12; and a transparent electrode 16 formed over the one-or-more layers 14 of organic light-emitting material; a light-scattering layer 22 having a rough surface formed over and in contact with the OLED; a cover 20 affixed to the substrate 10 forming a gap 18 between the cover 20 and the light scattering layer 22; and wherein the gap 18 is a vacuum or the gap 18 is filled with a relatively low-refractive index gas and the light-scattering layer 22 comprises a plurality of relatively high-refractive index light-scattering transparent particles 70 projecting into the gap 18 without contacting the cover 20 and further comprising an adhesive binder in contact with at least some of the light-scattering particles 70 to adhere the light-scattering particles 70 to the OLED. Transparent particles 70 are sufficiently transparent to pass at least a portion of light emitted by organic layers 14. An OLED-protective layer 24 may be formed over the transparent electrode 16 to protect the OLED. Preferably, when employed, the OLED protective layer 24 has an optical index equal to or greater than the index of the organic layers 14. As used herein, a rough surface is variable, irregular, and preferably discontinuous. A relatively low refractive index is one that is lower than the organic layers 14, transparent electrode 16, and cover 20, and, preferably has a refractive index less than 1.1. A relatively high refractive index is one that is higher than the refractive index of the material in the gap so as to cause significant refraction and scattering at the interface with the gap 18, and preferably is higher than the refractive index of the organic layers 14 or transparent electrode 16 and, accordingly more preferably has a refractive index greater than 1.8. If the gap 18 includes a gas, it may be nitrogen, argon, helium, or air and is preferably inert and non-reactive to the various OLED layers and light-scattering layer 22.

Figure 2A:
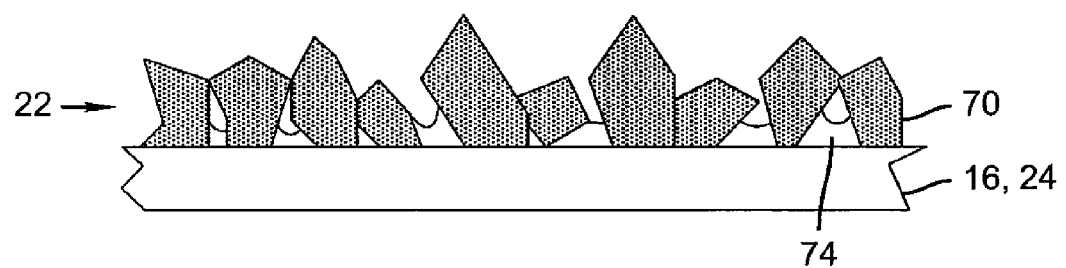
FIGS. 2A and 2B illustrate cross sections of scattering layers according to various embodiments of the present invention.
Figure 2B:
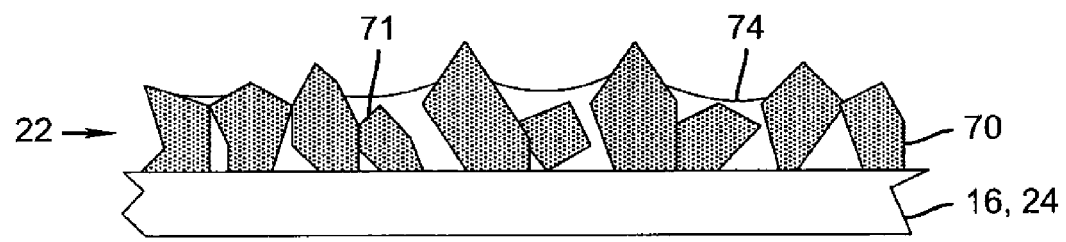

Referring to FIGS. 2A and 2B, the light-scattering layer 22 is shown in greater detail with adhesive binder 74 adhering the light-scattering particles 70 to the transparent electrode 16 or OLED-protective layer 24. As shown in FIG. 2A, a minimal amount of adhesive binder 74 is employed to adhere the light-scattering particles 70 to the OLED. As shown in FIG. 2B, a greater quantity of adhesive binder 74 is employed to adhere the light-scattering particles 70 to the OLED such that some of the light-scattering particles 71 are completely immersed in the adhesive binder 74. However, according to the present invention, in all cases at least a fraction of, and preferably most of, the light-scattering particles 70 project into the gap 18 without contacting the cover 20. When substantial amounts of adhesive binder 74 is used, the light scattering ability of the light-scattering particles 71 is superior if the index of refraction of the light scattering particles is substantially (>0.2) higher than the index of refraction of the adhesive binder.

Referring back to FIG. 1, it is helpful for the light-scattering layer to provide effective scattering over a broad range of frequencies. In some OLED device embodiments, the organic layers 14 emit white light and employ patterned color filters 40R, 40G, and 40B corresponding in position to the patterned reflective electrode 12 to provide a full-color display having colored sub-pixels 50R, 50G, and 50B. Even if the organic layers 14 are patterned with different organic materials that emit different colors of light, for example red, green, and blue, it is useful and inexpensive to employ and coat a single, unpatterned scattering layer 22 over the OLED to extract trapped light of all frequencies from every sub-pixel of whatever color. As described herein, any color filters 40 are considered to be part of the cover 20 and do not contact the light-scattering particles 70.

In operation an active-matrix OLED device such as that depicted in FIG. 1 employs thin-film electronic components 30 to provide a current through the patterned reflective electrode 12 and transparent, unpatterned electrode 16. Planarization insulating layers 32 and insulating layer 34 protect the electronic components and prevent patterned electrodes 12 from shorting to each other and thereby form light-emissive areas 50R, 50G, and 50B. When a current is provided between the electrodes, one or more organic layers 14 emit light. The light is emitted in all directions so that some light will be emitted toward the transparent electrode 16 and scattering layer 22, be scattered into the gap 18 and thence through the cover 20 out of the device. Likewise, some light will be emitted toward the reflective electrode 12, be reflected back toward the transparent electrode 16 and scattering layer 22, and then be scattered into the gap 18 and thence through the cover 20 out of the device. However, some fraction of the light will waveguide in the relatively high-index organic layers 14 and transparent electrode 16. This normally trapped light will also be scattered because the scattering layer 22 is optically coupled to the OLED, and may then pass into the gap 18, through the cover 20, and out of the OLED.

However, some fraction of the light will be scattered back into the OLED. This reflected light will again pass through transparent electrode 16 and organic layers 14, be reflected from reflective electrode 12, pass through the organic layers 14 and transparent electrode 16 a second time, and be-rescattered. Some of the re-scattered light will pass into the gap 18 and through the cover 20. The light that is reflected will again be reflected from the reflective electrode 12 until it does escape. Since light may pass repeatedly through the transparent electrode 16 and organic layers 14, and be reflected from the reflective electrode 12, it is helpful for the transparent electrode 16 and organic layers 14 to be as transparent as possible and the reflective electrode 12 to be as reflective as possible.

In any real OLED device, however, light will be lost to absorption and reflection. Therefore it is critical to both maximize the scattering of waveguided light and minimize the reflection from the scattering layer and absorption in the various layers. The scattering of waveguided light can be maximized by employing a light-scattering layer that has the maximum difference in refractive index between the light-scattering particles 70 and the surrounding environment. Hence, rather than employing light-scattering particles enclosed within a smooth layer of material, for example a polymeric matrix material having a refractive index of 1.5, the present invention employs light-scattering particles 70 that project into the gap 18. Since the gap 18 is a vacuum or is gas-filled (where most gases will have a relatively low refractive index, e.g., typically approximate 1), light scattering is enhanced. In contrast, if a relatively higher-index solid material matrix is employed, a thicker scattering layer is necessary to achieve the same scattering effectiveness. Such a thicker layer will both absorb more light and reflect more light, causing the reflected light to pass through, and be reflected by, the various OLED layers more often, increasing the light absorption in the OLED layers.

Figure 3:
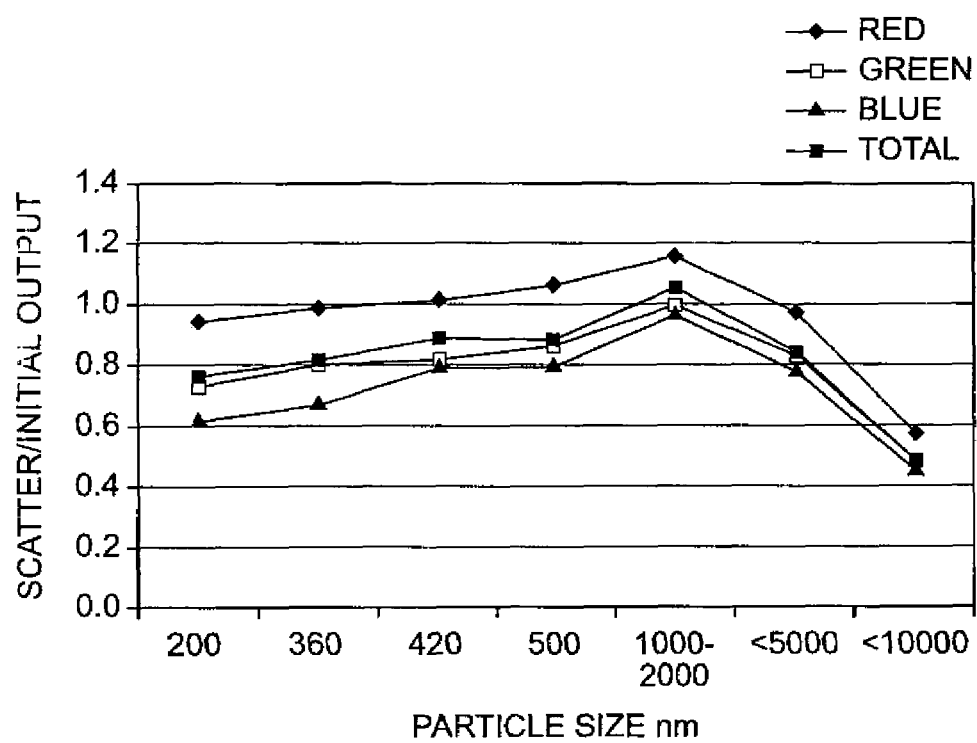
FIG. 3 is a graph depicting the performance of various scattering layers in an OLED.

Through experimentation, applicants have demonstrated that a maximum scattering effect with minimum light absorption and backwards scattering may be achieved through the use of scattering particles having an average maximum dimension size between 400 nm and 5 microns and, more preferably, having an average maximum dimension less than 2 microns and, even more preferably, having an average maximum dimension size between one micron and 2 microns and coated on an OLED with an average thickness of between about one and five microns, and, even more preferably in a coating with an average thickness of about one to two microns. Applicants have measured the overall light output of a variety of layers having different particle sizes, thicknesses, and adhesive binder. Referring to FIG. 3, the light extraction efficiency of layers having different particle sizes for different colors of light is plotted. FIG. 3 illustrates the optimum case for the top-emitting OLED structure disclosed and claimed in the present invention. In this experiment, the light-scattering particles comprised commercially available titanium dioxide particles. The absolute improvement in extraction efficiency was actually greater than the Y axis of FIG. 3 indicates, because the use of an OLED device with a small active area (0.1 cm$^2$) in this study caused the devices with scattering layers to emit from a somewhat larger area than devices without a scattering layer, and the plotted values are radiance rather than total light output.

Applicants have also demonstrated that without some adhesive binder 74 to adhere the light-scattering particles 70 to the OLED, the layer of light-scattering particles 70 may not be mechanically robust. Hence, a small amount of adhesive binder 74 may be employed to adhere the light-scattering particles 70 to the OLED and promote optical coupling from the OLED to the light-scattering particles. The adhesive binder 74 may comprise a polymer, for example polythiophene, polycarbonate, PET, PEN, PEDOT, polyvinylcarbazole, or urethane. In a particular embodiment, Solsperse 24000™ polymer dispersant manufactured by Avecia Ltd may be employed. Since, according to the present invention, the light-scattering particles 70 project into the gap 18, the adhesive binder 74 may not completely cover all the light-scattering particles to form a layer with a smooth surface. However, some portion of the adhesive binder 74 may be present on the light-scattering particles to cause them to adhere to the OLED and to each other to form a mechanically robust layer.

Figure 4:
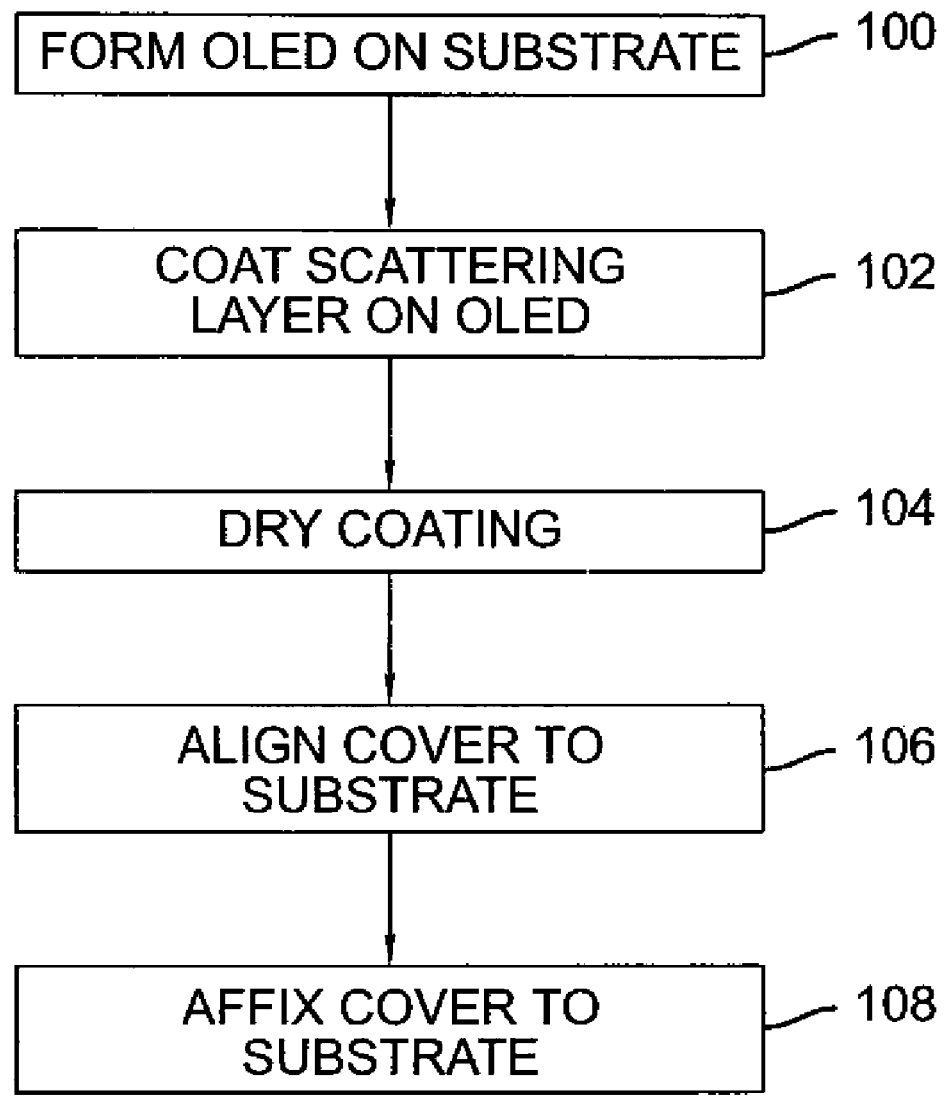
FIG. 4 is a flow diagram illustrating a method of making a device according to the present invention.
Figure 5:
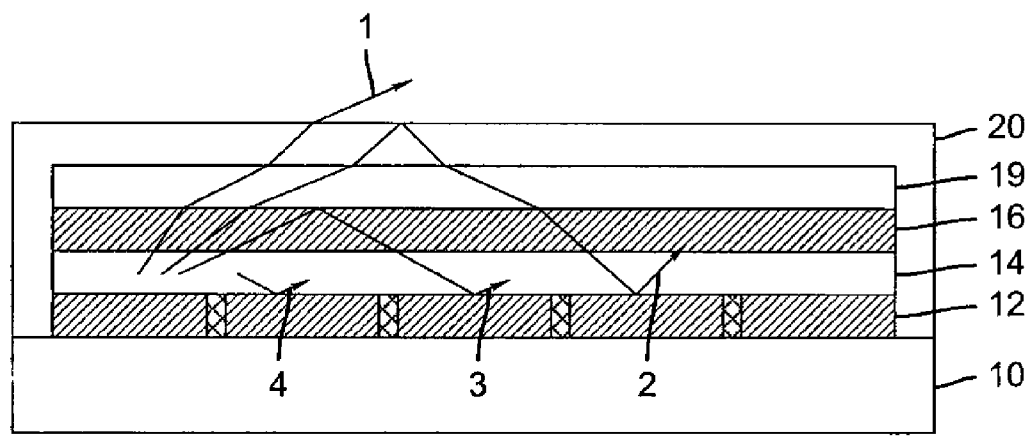
FIG. 5 illustrates a cross section of a prior-art top-emitter OLED device.
Figure 6:
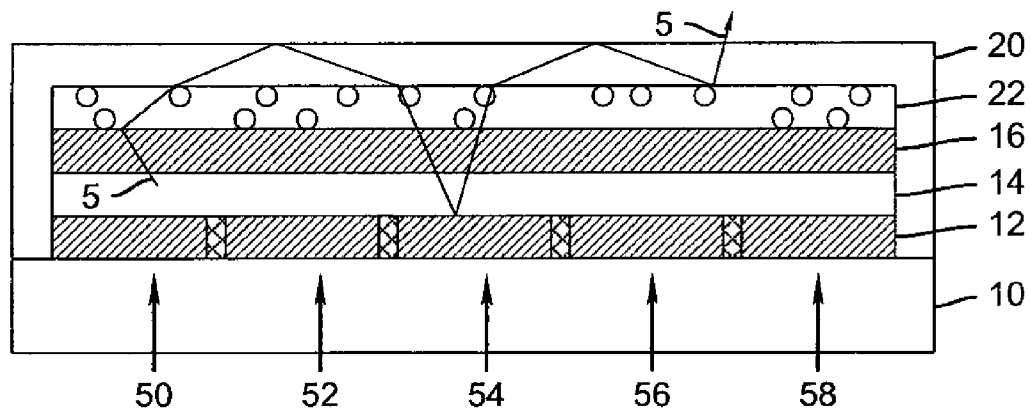
FIG. 6 illustrates a cross section of a prior-art top-emitter OLED device having a scattering layer.

Referring to FIG. 4, a top-emitting organic light-emitting diode (OLED) device of the present invention may be formed by a method comprising the steps of forming 100 an OLED over a substrate, the OLED comprising a reflective electrode formed on the substrate; one-or-more layers of organic light-emitting material formed over the reflective electrode; and a transparent electrode formed over the one-or-more layers of organic light-emitting material; coating 102 a dispersion comprising a solvent, relatively high-refractive index light-scattering transparent particles, and an adhesive binder over the OLED; drying 104 the coating to adhere the light-scattering particles to the OLED with the adhesive binder and form a light-scattering layer having a rough surface; and affixing 108 a cover to the substrate while forming a vacuum gap or a gap filled with a relatively low-refractive index gas between the cover and the light-scattering layer into which light-scattering particles project from the rough surface of the light-scattering layer without contacting the cover. If color filters are employed with the OLED device, the cover may be aligned 106 to the substrate before affixing 108 the cover to the substrate. Useful solvents may include toluene and xylene.

According to various embodiments of the present invention, the dispersion may be coated over the OLED by spin coating, ink jet coating, spray coating, or hopper coating. To aid in the formation of a thin layer that effectively scatters light with the minimum amount of light-scattering particles, a surfactant may be provided in the dispersion to discourage flocculation. In a preferred embodiment, the adhesive binder may itself also be a surfactant (e.g., Solsperse 24000™ polymer dispersant manufactured by Avecia Ltd). In other embodiments, the adhesive binder may be curable with heat or radiation. The present invention is preferred over some prior-art scattering layers in that expensive and potentially damaging processes such as photolithography or molding, or materials likely to introduce particulate contamination are not needed.

Applicants have demonstrated that a useful light-scattering particle layer with particles that project into an adjacent gap may be obtained by employing an adhesive binder that is less than 30% of the scattering layer by weight. Accordingly, when provided in a coating dispersion, the adhesive binder may comprise less than 30% by weight of the combined weight of the light-scattering particles and the adhesive binder. The concentration of solid materials (i.e., light-scattering particles and binder) combined preferably may be between 10% and 20% of the total coating dispersion by weight.

In preferred embodiments, the encapsulating cover 20 and substrate 10 may comprise glass or plastic with typical refractive indices of between 1.4 and 1.6. The transparent low-index gap 18 may comprise a vacuum gap or be filled with an optically transparent low-index gas material. For example air, nitrogen, helium, or argon all have a refractive index of between 1.0 and 1.1 and may be employed. Reflective electrode 12 is preferably made of metal (for example aluminum, silver, or magnesium) or metal alloys. Transparent electrode 16 is preferably made of transparent conductive materials, for example indium tin oxide (ITO) or other metal oxides. The organic material layers 14 may comprise organic materials known in the art, for example, hole-injection, hole-transport, light-emitting, electron-injection, and/or electron-transport layers. Such organic material layers are well known in the OLED art. The organic material layers typically have a refractive index of between 1.6 and 1.9, while indium tin oxide has a refractive index of approximately 1.8-2.1. Hence, the various layers 16 and 14 in the OLED have a refractive index range of 1.6 to 2.1. Of course, the refractive indices of various materials may be dependent on the wavelength of light passing through them, so the refractive index values cited here for these materials are only approximate. In any case, the transparent low-index gap 18 preferably has a refractive index lower than that of the organic materials, electrode materials, and cover at the desired wavelength for the OLED emitter. Scattering particles 70 of layer 22 preferably comprise material with a refractive index significantly greater than the transparent low-index gap 18. Particles of higher index, comparable to the refractive index range of the various layers 16 and 14 in the OLED, are preferred to insure that all of the light trapped in the organic layers 14 and transparent electrode 16 can experience the direction altering effects of scattering layer 22.

Whenever light crosses an interface between two layers of differing index (except for the case of total internal reflection), a portion of the light is reflected and another portion is refracted. Unwanted reflections can be reduced by the application of standard thin anti-reflection layers. Use of anti-reflection layers may be particularly useful on both sides of the encapsulating cover 20. Means of preventing the encapsulating cover 20 from contacting the layers in a top-emitter OLED device may also be useful in the present invention. For example spacer particles located in the gap 18 to prevent the cover 20 from contacting the scattering layer 22 or OLED may be employed. Alternatively, raised non-light-emitting areas in the OLED may contact the cover 20 or layers formed on the cover 20. It may also be advantageous to use light absorbing or light reflecting materials at these contact points in order to relax the alignment tolerances of the contact points. The scattering layer 22 may employ a variety of materials. For example, particles of $SiN_x$ (x>1), $Si_3N_4$, $TiO_2$, MgO, ZnO may be employed. Titanium dioxide (e.g., refractive index of 2.5 to 3) particles may be particularly preferred. Shapes of refractive particles may be variable or random, cylindrical, rectangular, or spherical, but it is understood that the shape is not limited thereto. Use of variable shaped particles is particularly preferred to enhance random scattering of light over wide wavelength and angle distributions. A large difference in refractive indices between materials in the scattering layer 22 and the low-index gap is generally desired, and may be, for example, from 0.3 to 3. It is generally preferred to avoid diffractive effects in the scattering layer. Such effects may be avoided, for example, by locating features randomly or by ensuring that the sizes or distribution of the refractive elements are not the same as the wavelength of the color of light emitted by the device from the light-emitting area. It is preferred that the total diffuse transmittance of the scattering layer coated on a glass support should be high (preferably greater than 80%) and the absorption of the scattering layer should be as low as possible (preferably less than 5%, and ideally 0%).

Most OLED devices are sensitive to moisture or oxygen, or both, so they are commonly sealed, for example with a perimeter adhesive 60, in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

As illustrated in FIG. 1, a very thin protective layer 24 of transparent encapsulating materials may be deposited on the transparent electrode 16. In this case, the scattering layer 22 may be deposited over the layers of encapsulating materials 24. This structure has the advantage of protecting the electrode 16 during the deposition of the scattering layer 22. Preferably, the layers of transparent encapsulating material 24 has a refractive index comparable to the refractive index range of the transparent electrode and organic layers, or is very thin (e.g., less than about 0.2 micron) so that wave guided light in the transparent electrode and organic layers will pass through the layers of transparent encapsulating material 24 and be scattered by the scattering layer 22.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover. Color conversion materials may also be incorporated directly in a scattering layer, such as described in U.S. Ser. No. 11/361,094 and U.S. Ser. No. 11/361,089, filed Feb. 24, 2006 by Ronald S. Cok et al., the disclosures of which are incorporated herein by reference.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 1, 2, 3, 4, 5 light rays
10 substrate
12 reflective electrode
14 organic layer(s)
16 transparent electrode
18 low-index gap
19 gap
20 encapsulating cover
22 scattering layer
24 OLED protection layer
30 thin-film electronic components
32 insulating planarization layer
34 insulating layer
40, 40R, 40G, 40B color filters
50, 52, 54, 56, 58 pixels
50R, 50G, 50B color sub-pixels
60 perimeter adhesive
70 light-scattering particles
71 light-scattering particles
74 adhesive binder
100 form OLED step
102 coat scattering layer step
104 dry coating step
106 align cover step
108 affix cover to substrate step

The invention claimed is:
1. A method of forming a top-emitting organic light-emitting diode (OLED) device, comprising the steps of:
  forming an OLED having a pre-determined refractive index over a substrate, the OLED comprising a reflective electrode; one-or-more layers of organic light-emitting material formed over the reflective electrode; and a transparent electrode formed over the one-or-more layers of organic light-emitting material;
  coating a dispersion comprising a solvent, visible-light-scattering transparent particles having a refractive index greater than the OLED pre-determined refractive index, and an adhesive binder over the OLED;
  drying the coated dispersion to adhere the visible-light-scattering particles to the OLED with the adhesive binder thereby forming a visible-light-scattering layer having a rough surface; and affixing a cover to the substrate while forming a vacuum gap or forming and filling a gap with a gas having a refractive index less than the OLED pre-determined refractive index between the cover and the visible-light-scattering layer into which visible-light-scattering particles project from the rough surface of the visible-light-scattering layer without contacting the cover.

2. The method of claim 1, wherein the dispersion is coated over the OLED by spin coating, ink jet coating, spray coating, or hopper coating.

3. The method of claim 1, further comprising the step of providing a surfactant in the dispersion.

4. The method of claim 1, wherein the adhesive binder is a surfactant.

5. The method of claim 1, wherein the adhesive binder is curable, and further comprising the step of curing the adhesive binder.

6. The method of claim 5, further wherein the step of curing the adhesive binder comprises heat curing or radiation curing.

7. The method of claim 1, wherein the adhesive binder comprises less than 30% by weight of the combined weight of the scattering particles and the adhesive binder.

8. The method of claim 1, wherein the light-scattering particles and adhesive binder combined form between 10% and 20% of the dispersion by weight.

* * * * *